United States Patent [19]

Yonezawa et al.

[11] Patent Number: 4,560,642
[45] Date of Patent: Dec. 24, 1985

[54] METHOD OF MANUFACTURING A SEMICONDUCTOR DEVICE

[75] Inventors: Toshio Yonezawa, Yokosuka; Takashi Ajima, Tokyo; Shunichi Hiraki, Yokohama; Yutaka Koshino, Tokyo; Yoshitami Oka, Kawasaki, all of Japan

[73] Assignee: Toyko Shibaura Electric Co., Ltd., Japan

[21] Appl. No.: 632,239

[22] Filed: Jul. 19, 1984

Related U.S. Application Data

[60] Continuation of Ser. No. 403,550, Jul. 30, 1982, abandoned, which is a division of Ser. No. 262,938, May 12, 1981, Pat. No. 4,351,894, which is a continuation of Ser. No. 047,216, Jun. 11, 1979, abandoned, which is a continuation of Ser. No. 827,347, Aug. 24, 1977, abandoned.

[30] Foreign Application Priority Data

Aug. 27, 1976 [JP] Japan ............... 51-102430
Oct. 26, 1976 [JP] Japan ............... 51-127808
Oct. 26, 1976 [JP] Japan ............... 51-127809

[51] Int. Cl.$^4$ .............................. B05D 1/32
[52] U.S. Cl. ............... 430/313; 204/129.65; 427/259; 156/DIG. 64; 156/659.1; 156/653
[58] Field of Search .............. 427/93, 95, 39, 85, 427/88, 259; 156/643, 600, DIG. 64, 653, 657, 659.1, 660; 430/314, 313, 317; 204/129.65; 148/187

[56] References Cited

U.S. PATENT DOCUMENTS 3,465,209 9/1969 Denning et al. ............... 317/234
3,502,517 3/1970 Sussmann ..................... 148/175
3,904,454 9/1975 Hagdo et al. .................. 148/187

FOREIGN PATENT DOCUMENTS 1589830 8/1970 Fed. Rep. of Germany .
1475359 2/1967 France .
1530218 5/1968 France .
1093567 12/1967 United Kingdom .
1142405 2/1969 United Kingdom .
1147014 4/1969 United Kingdom .
1188152 4/1970 United Kingdom .
1319079 5/1973 United Kingdom .

OTHER PUBLICATIONS

Bersin, Solid State Technology, 5/76, pp. 31–36.
Weaver, JBM Technical Disclosure Bulletin, vol. 17, No. 2, 7/74.

Primary Examiner—Hiram H. Bernstein
Attorney, Agent, or Firm—Finnegan, Henderson, Farabow, Garrett & Dunner

[57] ABSTRACT

A method of manufacturing a semiconductor device which comprises the step of applying a silicon carbide film having a prescribed perforated pattern as a masking film selectively to etch a silicon dioxide film or diffuse an impurity into a substrate.

3 Claims, 10 Drawing Figures

○ THIS INVENTION
△ PRIOR ART
— IDEAL

METHOD OF MANUFACTURING A SEMICONDUCTOR DEVICE

BACKGROUND OF THE INVENTION

Field of the Invention

This is a continuation of Ser. No. 403,550, filed July 30, 1982, now abandoned which was a division of application Ser. No. 262,938, filed May 12, 1981 (now U.S. Pat. No. 4,351,894 issued Sept. 28, 1982) which was a continuation of application Ser. No. 047,216, filed June 11, 1979 (abandoned), which was a continuation of application Ser. No. 827,347, filed Aug. 24, 1977 (abandoned).

This invention relates to a method of manufacturing a semiconductor device and more particularly to improvements on a masking film used in selective etching or diffusion of an impurity.

DESCRIPTION OF THE PRIOR ART

Hitherto, selective etching of a silicon dioxide film formed on a semiconductor substrate has been effected by application of a photoresist film having a prescribed perforated pattern as an etching mask and using an etching solution such as ammonium fluoride or hydrofluoric acid. A silicon dioxide film thus selectively perforated has later been used intact not only as a masking film for diffusion of an impurity but also often as a protective or insulating film.

However, a photoresist, particularly, a positive working photoresist used as an etching mask has insufficient adhesivity to a silicon dioxide film and has been found inadequate for etching of long time and etching of a finely defined pattern. Application of such a photoresist was further accompanied with the drawbacks that the dimensions of a perforated pattern formed through a said photoresist in a silicon dioxide film mounted on a substrate noticeably varied with an amount of light to which the photoresist was initially exposed to produce an etching mask; and that a silicon dioxide film selectively perforated by means of the photoresist, when used as an impurity diffusing mask, caused the dimensions of a semiconductor region formed in a substrate also prominently to vary with the degree of exposure to light.

It is accordingly an object of this invention to provide a novel mask adapted to be applied in the manufacture of a semiconductor device.

Another object of the invention is to provide a method of manufacturing a semiconductor device which comprises the step of using a masking film having a high adhesivity to an underlying film to attain a prominent dimensional precision of a perforated pattern.

SUMMARY OF THE INVENTION

The method of this invention for manufacturing a semiconductor device comprises the steps of forming one or more films on the surface of a semiconductor substrate and perforating at least one film thereof in the prescribed pattern to provide a masking film which is prepared from silicon carbide. This masking film of silicon carbide is adapted to be used for etching of an underlying silicon dioxide film or diffusion of an impurity into the substrate.

BRIEF DESCRIPTION OF THE DRAWING

This invention can be more fully understood from the following detailed description when taken in conjunction with the accompanying drawings, in which.

DESCRIPTION OF THE PREFERRED EMBODIMENT

A semiconductor device-manufacturing method according to a first embodiment of this invention comprises the steps of forming a silicon dioxide film on a semiconductor substrate; mounting on said silicon dioxide film a masking film prepared from silicon carbide and perforated in the prescribed pattern; and selectively etching the silicon dioxide film through said masking film of silicon carbide. A semiconductor device-manufacturing method according to a second embodiment of the invention comprises the steps of forming a masking film prepared from silicon carbide and perforated in the prescribed pattern directly on a semiconductor substrate and diffusing an impurity in the semiconductor substrate through the perforated pattern of said silicon carbide masking film.

Figure 1A:
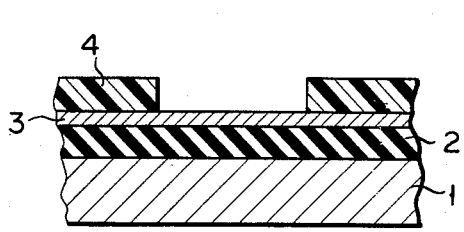
FIGS. 1a to 1c are schematic sectional views showing the sequential steps of manufacturing a semiconductor device embodying the method of this invention and showing an SiC mask formed by etching it on an $SiO_2$ layer.

There will now be described by reference to the attached drawings a semiconductor device-manufacturing method according to the first embodiment of this invention. This method comprises the steps of forming a silicon dioxide film 2 on a semiconductor substrate 1 by the customary process; mounting a silicon carbide film 3 all over said silicon dioxide film 2; and setting a photoresist 4 perforated in the prescribed pattern on said silicon carbide film 3 by the customary process (FIG. 1a). The silicon carbide film 3 may be laminated on the underlying film by any of the undermentioned processes.

(1) A first process is by chemical vapor deposition (hereinafter referred to as "CVD"). This process comprises the steps of thermally reacting silane such as silicon tetrahydride with toluene in an atmosphere of hydrogen and depositing the resultant silicon carbide on the underlying film. The reaction temperature is preferred to range between 600° C. and 1,200° C. If the reaction temperature applied stands at a level relatively approaching the lower limit of this prescribed range, then amorphous silicon carbide will be grown. Conversely, if the reaction temperature applied indicates a level relatively approaching the upper limit of said prescribed range, then crystalline silicon carbide will be formed. This process produces silicon carbide at the rate of 500 Å to 3,000 Å/min.

(2) A second process is by sputtering. This process comprises the steps of impinging argon accelerated by high frequency waves on a target of silicon carbide to scatter the silicon carbide for deposition on the underlying film. This process forms silicon carbide at the rate of about 100 Å/min.

(3) A third process is by plasma deposition. This process comprises the step of converting a gaseous mixture of silicon or silane and toluene or acetylene into a plasma, for example, by glow discharge for reaction of the component gases. To describe in greater detail, where silicon is used, silicon is vaporized, for example, by electron beams. The vaporized silicon is conducted into a vacuum reaction chamber together with a gas of toluene or acetylene for reaction in the form of a plasma. The resultant silicon carbide is deposited on a semiconductor substrate. In this case, the substrate may or may not receive direct current or be heated. The degree of vacuum applied is chosen to range between $10^{-3}$ and $10^{-4}$ Torr.

This process grows silicon carbide at the rate of about 100 Å/min.

Where it is not desired to heat a semiconductor substrate to an elevated temperature, the process (2) or (3) is preferred.

Where it is demanded to obtain a thick film of silicon carbide, the process (1) is more advantageous.

The silicon carbide film 3 is generally preferred to have a thickness of 50 Å, though not critical.

Figure 1B:
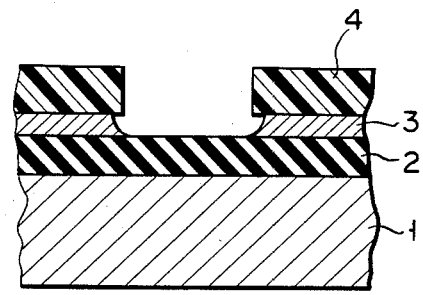

The silicon carbide film 3 thus prepared is selectively etched through the photoresist film 4 as an etching mask (FIG. 1b). The silicon carbide film 3 is etched by any of the undermentioned processes.

(1) A first etching process is by plasma etching. The process comprises the steps of converting carbon tetrafluoride or a mixture thereof with oxygen into a plasma, for example, by glow discharge and etching silicon carbide by exposure to said plasma. In this case, the temperature at which the plasma etching is undertaken is chosen to range between room temperature and about 100° C. The etching rate is generally set at about 100 Å to 500 Å/min.

(2) A second etching process is by electrolytic etching. An electrolyte used is selected from the following compounds:

(a)

(b)

(c)

The electrolytic etching is carried out at room temperature, by introduction of direct electric field of 1 to 10 volts and with electrolyzing current of 0.1 to 5 amperes. The etching rate is chosen to range approximately between 50 Å and 200 Å/min.

Most preferred among the above-mentioned etching processes is the process (1) which eliminates the necessity of treating waste liquid.

Figure 1C:
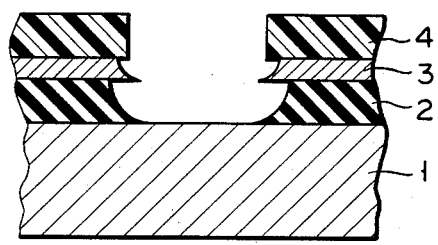

The silicon carbide film 3 perforated in the prescribed pattern is used as a mask in the selective etching of the underlying silicon dioxide film 2 (FIG. 1c). The silicon dioxide film 2 may be etched by the customary process using, for example, hydrofluoric acid or ammonium fluoride. FIG. 1c shows the photoresist film 4 still left in a semiconductor device. However, this photoresist film 4 may be removed before the silicon dioxide film 2 is etched.

Figure 2A:
FIGS. 2a to 2c are schematic sectional views showing the sequential steps of manufacturing a masking film of silicon carbide according to the method of the invention and showing an SiC mask being formed without etching directly on a semiconductor substrate.
Figure 2B:
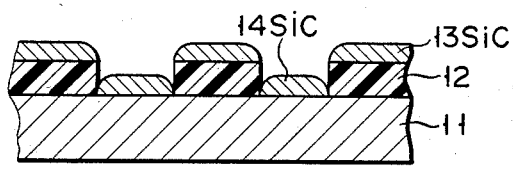
Figure 2C:
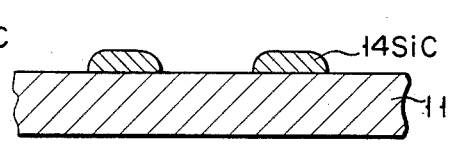

There will now be described the so-called "lift off" process which comprises the step of providing a silicon carbide masking film perforated in the prescribed pattern without previously etching said silicon carbide film. FIGS. 2a to 2c show a concrete example of the "lift off" process, that is, the method of forming a silicon carbide masking film directly on a semiconductor substrate according to the second embodiment of this invention. According to this "lift off" process, a photoresist film 12 perforated in the prescribed pattern is first formed on a semiconductor substrate 11 by the customary process (FIG. 2a). A silicon carbide film is mounted on the exposed portions of the substrate 11 and photoresist 12 by one of the previously described processes of depositing a silicon carbide film (FIG. 2b). Referential numeral 13 denotes a silicon carbide film formed on the photoresist film 12, and referential numeral 14 shows a silicon carbide film grown on the semiconductor substrate 11. In this case, the silicon carbide film 14 should be made thinner than the photoresist film 12. For example, the formation of the photoresist film 12 with a thickness of 1 to 3 microns and the silicon carbide film 14 with a thickness of 0.3 to 1 micron brings about a good effect. Last where the photoresist film 12 is removed by a proper solvent then the silicon carbide film 13 mounted on the photoresist film 12 is also taken off (FIG. 2c).

A silicon carbide film used with the method of this invention may contain one or more impurities such as phosphorus, aluminium, lead, boron, titanium, gallium, zinc, zirconium, strontium, chromium, molybdenum, tungsten, nickel, iron, cobalt, arsenic and tantalum. The concentration of an impurity is chosen to be $10^{19}$ to $10^{22}$ atom/cm$^3$, or preferably $10^{20}$ to $10^{21}$ atom/cm$^3$.

According to the first embodiment of the method of this invention, a silicon carbide masking film is used for selective perforation of a silicon dioxide film. Later, the perforated pattern of the silicon dioxide film may be applied in diffusion of an impurity or deposition of an electrode. According to the second embodiment of the method of the invention, the silicon carbide masking film is used to diffuse an impurity. The silicon carbide masking film put to the above-mentioned application may later be etched off or left intact. A silicon carbide film remaining in a semiconductor device effectively obstructs the intrusion of an impurity, for example, a sodium ion.

Test was made of the adhesivity to a silicon dioxide film of a silicon carbide masking film prepared by the method of this invention.

Figure 3:
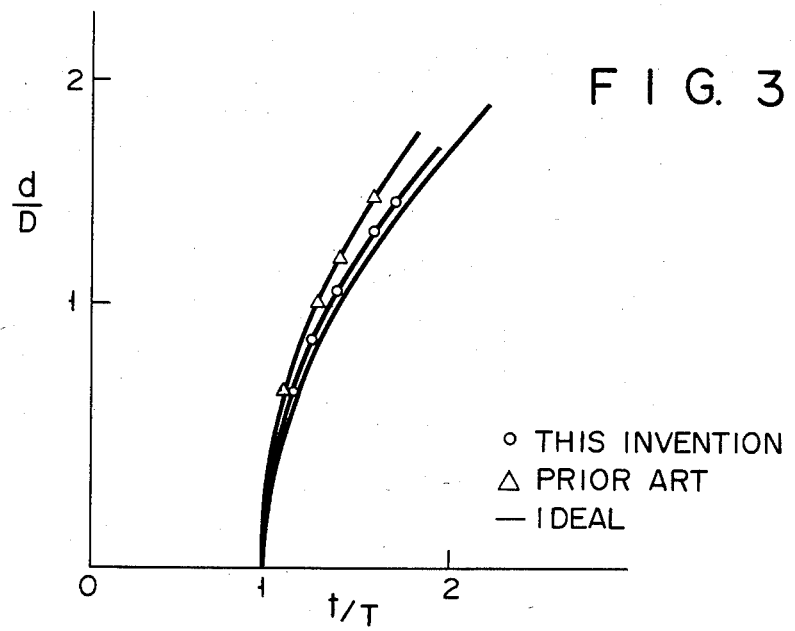
FIG. 3 is a curve diagram showing the actual adhesivity of a photoresist masking film and silicon carbide masking film to a silicon dioxide film as compared with the condition of ideal adhesivity.

The test was undertaken as follows. A silicon carbide masking film was deposited on a silicon dioxide film already mounted on a silicon substrate. The underlying silicon dioxide film was selectively etched through the silicon carbide masking film by an acid solution of ammonium fluoride. By way of comparison, the silicon dioxide film was selectively etched through an ordinary photoresist masking film instead of the silicon carbide masking film of this invention, using the same etchant. During this test, a period of time required for that side of a silicon dioxide film having a thickness of D which contacted the surface of a silicon substrate to be progressively etched up to a point right below that edge of the overlying silicon carbide masking film which faced the proceeding directions of etching was designated as a just etching time T. With the etching time T varied, measurement was made of a distance d by which the side of the silicon dioxide film contacting the surface of the substrate was overetched beyond a point right below the aforesaid edge of the overlying silicon carbide masking film. The ratios of d/D and t/T were plotted on the ordinate and abscissa respectively, as shown in FIG. 3. Where the silicon carbide masking film ideally adheres to silicon dioxide film, then etching proceeded at the same rate in all directions of the silicon dioxide film. This case is indicated as "ideal" in FIG. 3, which shows that the silicon carbide masking film of this invention more ideally adhered to the silicon dioxide film than the prior art photoresist masking film.

Figure 4:
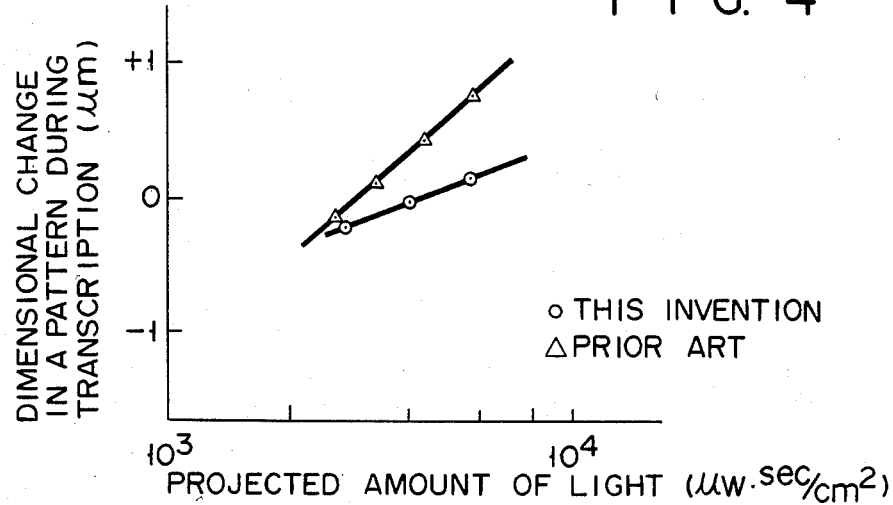
FIG. 4 is a curve diagram indicating the dimensional changes in the perforated pattern of samples of a silicon dioxide film prepared by the method of the invention and the prior art process which resulted from variations in an amount of light to which a photomask was initially exposed.

Next, comparison was made between the degree of precision with which a semiconductor device was manufactured by the method of this invention and the prior art technique. A photoresist film, silicon carbide film and silicon dioxide film were deposited on the substrate in the order mentioned as counted from above. The silicon carbide film was selectively perforated by photoetching through the overlying photoresist film. The silicon dioxide film was selectively etched through the perforated silicon carbide masking film. For comparison, the silicon dioxide film was selectively etched only through the photoresist film according to the prior art technique. These experiments were conducted by varying an amount of light initially projected to bake a prescribed pattern to the photoresist film. With the respective semiconductor devices manufactured by the method of this invention and the prior art technique, the original dimensions of any prescribed spot of a light-projecting photomask were subtracted from the dimensions of the corresponding spot of each silicon dioxide insulation film to determine a dimensional change occurring in transcribing a perforated pattern from the photomask to the silicon dioxide insulation film. An amount of light ($\mu$m·sec/cm$^2$) initially projected on a photomask is plotted on the abscissa of FIG. 4, and a dimension of change ($\mu$m) occurring in transcribing a perforated pattern from the photomask to the silicon dioxide insulation film is plotted on the ordinate. FIG. 4 proves that the semiconductor-manufacturing method of this invention enables the dimensional change of a perforated pattern to be minimized when it is transcribed from the photomask to the silicon dioxide insulation film, and has a far more excellent pattern reproducibility than has been possible with the prior art process.

Figure 5:
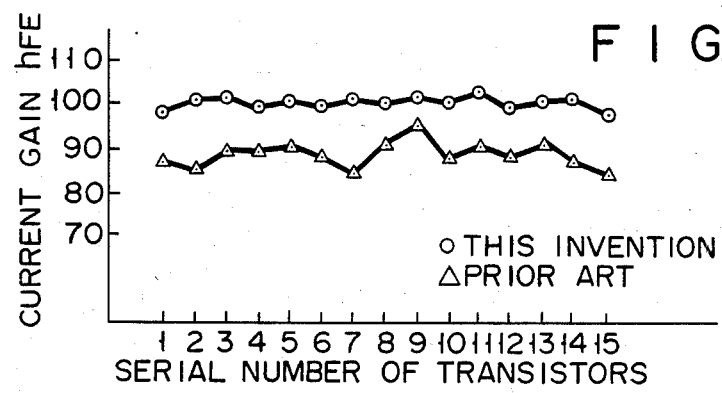
FIG. 5 is a curve diagram showing the current gains of numerous transistors manufactured by the method of the invention and the prior art process.

FIG. 5 graphically presents a comparison between the degree of uniformity in the current gain of transistors manufactured by the method of this invention and the prior art process. Each groups of fifteen transistors manufactured by both methods was selected in an oblique direction from a large number of transistors produced in a single silicon wafer by the respective processes. FIG. 5 indicates that a transistor obtained by the method of this invention has a higher current gain and presents smaller variations in said gain than a transistor based on the prior art process.

Figure 6:
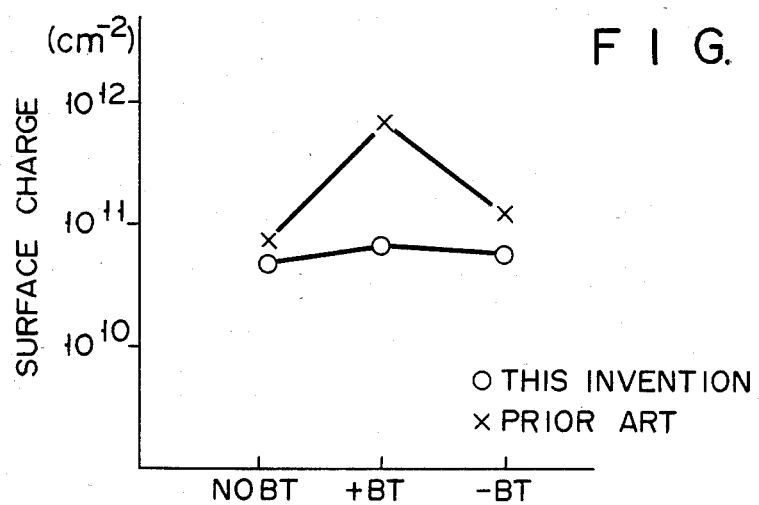
FIG. 6 graphically presents the surface charge of MOS varactor diodes manufactured by the method of the invention and the prior art process measured by a bias temperature test.

Test was made of the property of a silicon carbide masking film of preventing an impurity, for example, a silicon ion from being carried into a semiconductor device when said silicon carbide masking film is left intact in the device. Measurement was made by the bias-temperature test method of an amount of surface charge with respect to the prior art MOS varactor diode only having a silicon dioxide insulation film and an MOS varactor diode manufactured by the method of this invention which had not only a silicon dioxide insulation film but also a silicon carbide masking film left thereon. The test was conducted as follows. The respective MOS varactor diodes were dipped 30 minutes in a solution containing a sodium ion, and, after taken out of the solution, were baked 10 hours at a temperature of 200° C. Semiquantitative measurement was made of an amount of mobile ions present in the respective varactor diodes at three conditions, that is, just as baked, (this condition is referred to as NO BT), after impressed with positive bias voltage (this condition is denoted as +BT), and after impressed with negative bias voltage (this condition is represented as −BT), the results being presented in FIG. 6. It is seen from FIG. 6 that a semiconductor device manufactured by the method of this invention with a silicon carbide masking film left intact therein presents far smaller changes in an amount of surface charge and more effectively obstructs the intrusion of an impurity, for example, a sodium ion than the prior art semiconductor device. Therefore, the method of this invention can accurately reproduce a finely defined perforated pattern of a silicon dioxide insulation film or semiconductor regions and manufacture a prominently stable semiconductor device.

What we claim is:

1. A method of preparing a silicon dioxide film perforated in a prescribed pattern, the film to be used as a mask on the surface of semiconductor material for manufacture of a dimensionally precise semiconductor device, the method comprising:
    (a) forming a silicon dioxide film substantially covering the surface of the semiconductor material;
    (b) adheringly covering said silicon dioxide film with a silicon carbide mask comprising a silicon carbide film perforated in the prescribed pattern wherein the silicon carbide mask is formed by a "lift off" process with the prescribed perforated pattern;
    (c) selectively etching said silicon dioxide film using hydrofluoric acid or ammonium fluoride through the perforations having the prescribed pattern in said silicon carbide mask, thereby providing a dimensionally precise silicon dioxide mask for diffusion of an impurity or deposition of an electrode.

2. The method as in claim 1 wherein said "lift off" process includes the sub-steps of
    (i) forming a photoresist film on said silicon dioxide layer, said photoresist film being perforated in the prescribed pattern to expose portions of said silicon dioxide layer,
    (ii) depositing a layer of silicon carbide over said photoresist film and said exposed silicon dioxide layer portions, and
    (iii) removing said photoresist film together with the part of said silicon carbide layer overlying said photoresist film.

3. The method as in claim 2 wherein the thickness of said silicon carbide layer is less than the thickness of said photoresist film, and wherein said photoresist film and overlying silicon carbide layer part are removed using a solvent.

* * * * *